(12) United States Patent
Kim

(10) Patent No.: US 11,456,158 B2
(45) Date of Patent: Sep. 27, 2022

(54) CERAMIC STRUCTURE FOR PLASMA PROCESSING APPARATUS AND MANUFACTURING METHOD THEREOF

(71) Applicant: KSM COMPONENT CO., LTD., Gimpo-si (KR)

(72) Inventor: Joo Hwan Kim, Incheon (KR)

(73) Assignee: KSM COMPONENT CO., LTD., Gimpo-si (KR)

( * ) Notice: Subject to any disclaimer, the term of this patent is extended or adjusted under 35 U.S.C. 154(b) by 310 days.

(21) Appl. No.: 16/892,427

(22) Filed: Jun. 4, 2020

(65) Prior Publication Data
US 2020/0388469 A1 Dec. 10, 2020

(30) Foreign Application Priority Data
Jun. 5, 2019 (KR) .................. 10-2019-0066926

(51) Int. Cl.
*H01J 37/32* (2006.01)
*H01J 9/30* (2006.01)
*C04B 35/645* (2006.01)
*H01J 9/36* (2006.01)

(52) U.S. Cl.
CPC ...... *H01J 37/32577* (2013.01); *C04B 35/645* (2013.01); *H01J 9/30* (2013.01); *H01J 9/36* (2013.01); *H01J 37/32724* (2013.01)

(58) Field of Classification Search
CPC ........... H01J 37/32577; H01J 9/30; H01J 9/36
See application file for complete search history.

(56) References Cited

U.S. PATENT DOCUMENTS

| | | |
|---|---|---|
| 2002/0134488 A1 | 9/2002 | Harada et al. |
| 2005/0269012 A1 | 12/2005 | Saito |
| 2010/0224396 A1 | 9/2010 | Nomiya |
| 2014/0231019 A1 | 8/2014 | Kajihara |
| 2015/0371854 A1 | 12/2015 | Davis |
| 2016/0126174 A1 | 5/2016 | Shen et al. |
| 2018/0308722 A1 | 10/2018 | Umeki et al. |
| 2019/0157127 A1 | 5/2019 | Nosrati et al. |
| 2020/0219755 A1 | 7/2020 | Akatsuka et al. |

FOREIGN PATENT DOCUMENTS

| | | |
|---|---|---|
| CN | 101874429 B | 4/2013 |
| JP | 11-157946 A | 6/1999 |
| JP | 2003-86519 A | 3/2003 |
| JP | 2003-163259 A | 6/2003 |
| JP | 2003-163529 A | 6/2003 |
| JP | 2004-034758 A | 2/2004 |
| JP | 3678229 B2 * | 8/2005 |
| JP | 2012-080103 A | 4/2012 |

(Continued)

*Primary Examiner* — Joseph L Williams
(74) *Attorney, Agent, or Firm* — Sughrue Mion, PLLC

(57) ABSTRACT

A ceramic structure including a first conductive structure embedded therein and a second conductive structure embedded at a different depth from the first conductive structure is disclosed. In the ceramic structure, the first conductive structure and the second conductive structure are electrically connected to each other by an electrically conductive connection member capable of compensating for a vertical shrinkage rate of a ceramic sheet shape while being embedded therein when sintering the ceramic structure.

20 Claims, 4 Drawing Sheets

(56) References Cited

FOREIGN PATENT DOCUMENTS

| KR | 10-2002-0075305 A | 10/2002 |
|----|-------------------|---------|
| KR | 10-2014-0065016 A | 5/2014  |
| KR | 10-2018-0117546 A | 10/2018 |
| TW | 200304909 A       | 10/2003 |
| TW | 201622093 A       | 6/2016  |
| WO | 2004/034758 A1    | 4/2004  |
| WO | 2019/082821 A1    | 5/2019  |
| WO | 2019/104040 A1    | 5/2019  |

* cited by examiner

CERAMIC STRUCTURE FOR PLASMA PROCESSING APPARATUS AND MANUFACTURING METHOD THEREOF

CROSS-REFERENCE TO RELATED APPLICATION

This application claims under 35 U.S.C. § 119(a) the benefit of Korean Patent Application No. 10-2019-0066926 filed on Jun. 5, 2019, the entire contents of which are incorporated herein by reference.

BACKGROUND

(a) Technical Field

The present invention relates to a ceramic structure for a plasma processing apparatus and a manufacturing method thereof.

(b) Background Art

A ceramic structure in which a conductive structure such as an RF electrode and/or a heater electrode is embedded therein is used as a supporter or the like for plasma processing of a wafer and the like during a semiconductor manufacturing process.

In the ceramic structure, the conductive structure such as the RF electrode and/or the heater electrode requires lateral connection and axial connection for electrical connection between the structures. In the case of the lateral connection, a connection member may be used to electrically connect the conductive structures by a general method. However, in the case of the axial (vertical) connection, since the ceramic structure greatly shrinks in the axial direction during sintering, it is difficult to perform a direct connection in the ceramic structure.

Specifically, the reasons for the above will be described as follows.

In order to manufacture the ceramic structure including the conductive structure, a process of inserting the conductive structure in a ceramic powder state and sintering the conductive structure at a high temperature and high pressure is required. Since the high pressure is applied in an axial direction in the sintering process, the lateral shrinkage of the ceramic powder is not large, but the axial shrinkage under a large pressure occurs largely. On the other hand, in the sintering process, a vertical conductive connection member (e.g. a metal member, etc.) for axial connection generally does not shrink as much as ceramic powder. Therefore, due to a difference in shrinkage rate, when sintering the ceramic structure, there is a problem that a conductive structure such as an RF electrode and/or a heater electrode is damaged or an electrical connection is broken by the vertical conductive connection member.

Therefore, in order to solve these problems, it is necessary to attempt the vertical connection between the conductive structures by predicting the shrinkage amount of the ceramic powder and the vertical conductive connection member. However, since it is difficult to accurately predict the shrinkage amount between the ceramic powder and the vertical conductive connection member (e.g. a metal member, etc.), when the axial connection is attempted in this way, a problem necessarily occurs such that a contact between the conductive structure and the vertical conductive connection member is not made or the conductive structures are damaged or deformed by the vertical conductive connection member due to excessive axial shrinkage of the ceramic powder.

Therefore, a conventional ceramic structure including a conductive structure such as an RF electrode and/or a heater electrode uses a lateral connection structure between conductive structures, but does not use an axial connection structure.

For example, in Korean Patent Publication No. 10-2014-0065016, as shown in FIG. 1, there are disclosed a ceramic substrate 6 in which a first RF electrode 1, a second RF electrode 2, and a heater electrode 3 are embedded, and a susceptor comprising the same. Since the first RF electrode 1 and the second RF electrode 2 are characterized by varying shapes and sizes (see claim 1), forming the electrical connection to the RF electrodes inside the ceramic substrate 6 is preferable in terms of simplifying the manufacturing process of the ceramic substrate 6, preventing contamination of the RF electrodes, and improving the durability of the RF electrodes by preventing corrosion. However, in the prior art, according to difficulty in the axial electrical connection described above, separate lead wires 4 and 5 are connected to the first RF electrode 1 and the second RF electrode 2, respectively, and these lead wires are connected to an RF power supply.

When the separate lead wires 4 and 5 are used as described above, since a lateral connection line is formed from each RF electrode to the lead wire, a connection with each lead wire needs to be made through soldering, and there are spatial limitations in the work, the manufacturing process is increased, and since each lead wire is required, it is also undesirable in cost. In addition, since the ceramic structure is used in an environment requiring corrosion resistance such as a semiconductor process, as in the prior art, when the electrical connection member is exposed to the outside of the ceramic member, there is a disadvantage of shortening a lifespan caused by rapid corrosion, contamination by particles, etc. In addition, there is a disadvantage of generating electrical noise according to a bonding structure.

PRIOR ART DOCUMENT

Patent Document

Korean Patent Publication No. 10-2014-0065016

SUMMARY OF THE DISCLOSURE

The present inventors have made many efforts to solve the problems of the related art described above, found a method capable of forming an axial connection structure between conductive structures without side effects in a ceramic structure in which conductive structures such as an RF electrode and/or a heater electrode are embedded, and then completed the present invention.

Therefore, an object of the present invention is to provide a ceramic structure in which conductive structures such as an RF electrode and/or a heater electrode and electrical connection structures capable of connecting the conductive structures in an axial direction without side effects are embedded.

Another object of the present invention is to provide a manufacturing method capable of efficiently manufacturing the ceramic structure.

In order to achieve the object, the present invention provides a manufacturing method of a ceramic structure comprising: (a) forming a ceramic sheet shape of a first layer; (b) forming a first conductive structure on the ceramic sheet shape of the first layer; (c) forming a ceramic sheet shape of a second layer on the first conductive structure; (d) embedding an electrically conductive connection member capable of compensating for a vertical shrinkage rate of the ceramic sheet shape in the ceramic sheet shape of the second layer; (e) forming a second conductive structure on the ceramic sheet shape of the second layer; (f) forming a ceramic sheet shape of a third layer on the second conductive structure; and (g) sintering a ceramic sheet-shaped laminate manufactured in step (f), wherein the ceramic structure includes a structure in which the first conductive structure and the second conductive structure are electrically connected to each other by the electrically conductive connection member capable of compensating for the vertical shrinkage rate of the ceramic sheet shape.

Further, the present invention provides a ceramic structure including a first conductive structure embedded therein and a second conductive structure embedded at a different depth from the first conductive structure, wherein the first conductive structure and the second conductive structure are electrically connected to each other by the electrically conductive connection member capable of compensating for the vertical shrinkage rate of the ceramic sheet shape while being embedded therein when sintering the ceramic structure.

Further, the present invention provides a plasma processing apparatus including the ceramic structure of the present invention as a supporter of a processing substrate.

According to the present invention, the ceramic structure can connect the conductive structures such as an RF electrode and/or a heater electrode in an axial direction without side effects in the ceramic structure by using the electrically conductive connection member capable of compensating for the vertical shrinkage rate of the ceramic sheet shape, thereby providing lifespan improvement and cost reduction effects.

Further, the ceramic structure provides effects of simplifying a connection process between the conductive structure and the power supply unit formed in the ceramic structure, enabling a rigid connection between the conductive structures, and minimizing noise caused by the connection between the conductive structures.

Further, according to the manufacturing method of the ceramic structure, it is possible to provide a method capable of very efficiently manufacturing the ceramic structure described above.

BRIEF DESCRIPTION OF THE DRAWINGS

The above and other features of the present invention will now be described in detail with reference to certain embodiments thereof illustrated the accompanying drawings which are given hereinbelow by way of illustration only, and thus are not limitative of the present invention, and wherein.

DETAILED DESCRIPTION

Figure 1:
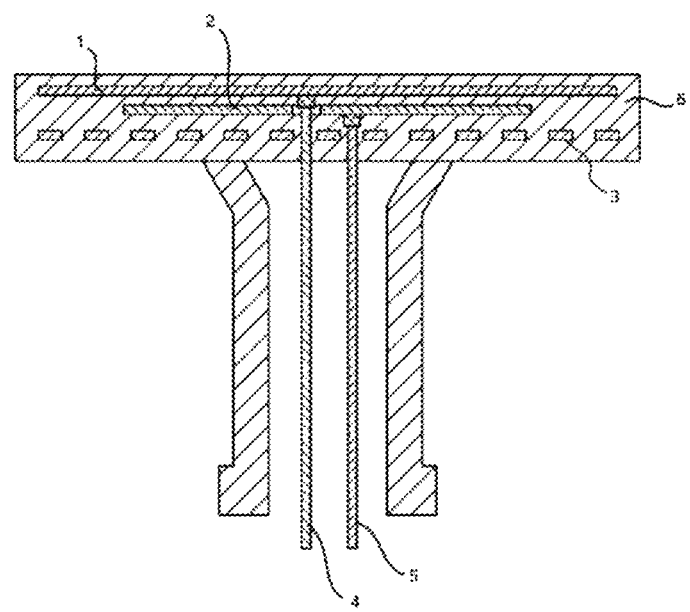
FIG. 1 is a diagram schematically illustrating an example of a ceramic structure of the related art.

Hereinafter, embodiments of the present invention will be described in detail with reference to the accompanying drawings so as to be easily implemented by those skilled in the art. However, the present invention may be embodied in many different forms and are limited to embodiments described herein. Throughout the specification, like reference numerals refer to like elements.

The present invention relates to a manufacturing method of a ceramic structure.

Figure 2A:
FIG. 2A-FIG. 2F schematically illustrate an embodiment of a manufacturing method of a ceramic structure according to the present invention.
Figure 2B:
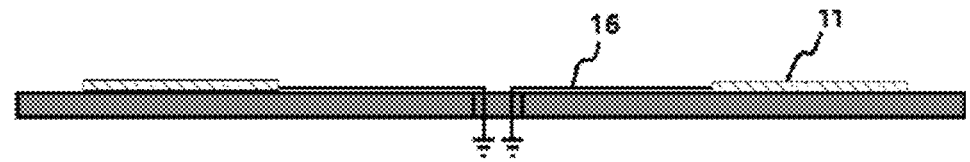
Figure 2C:
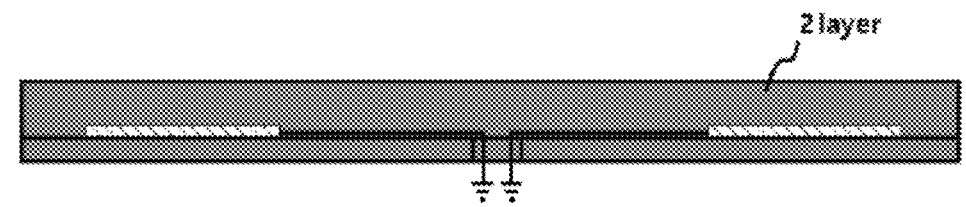
Figure 2D:
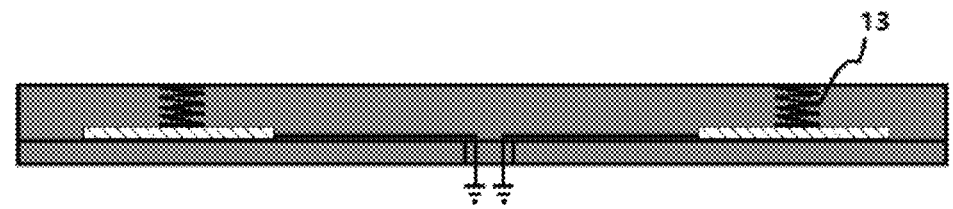
Figure 2E:
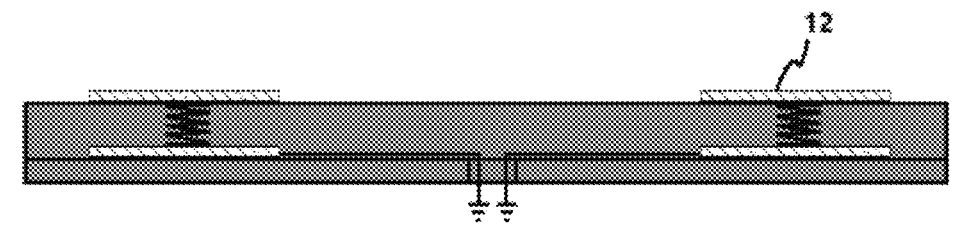
Figure 2F:
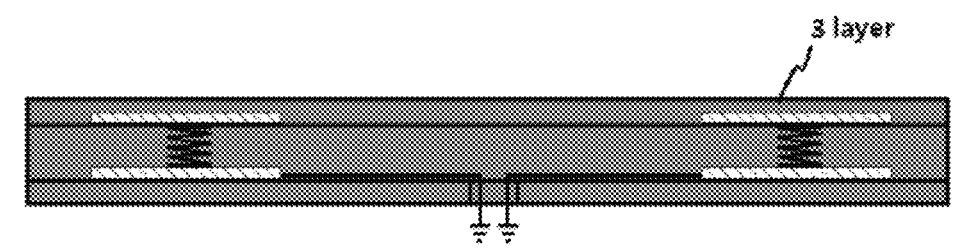

As illustrated in FIGS. 2A-2F, the manufacturing method comprises:

(a) forming a ceramic sheet shape of a first layer (FIG. 2A);

(b) forming a first conductive structure 11 on the ceramic sheet shape of the first layer (FIG. 2B);

(c) forming a ceramic sheet shape of a second layer on the first conductive structure (FIG. 2O);

(d) embedding an electrically conductive connection member 13 capable of compensating for a vertical shrinkage rate of the ceramic sheet shape in the ceramic sheet shape of the second layer (FIG. 2D);

(e) forming a second conductive structure 12 on the ceramic sheet shape of the second layer (FIG. 2E);

(f) forming a ceramic sheet shape of a third layer on the second conductive structure (FIG. 2F); and (g) sintering a ceramic sheet-shaped laminate manufactured in step (f), wherein the ceramic structure includes a structure in which the first conductive structure and the second conductive structure are electrically connected to each other by the electrically conductive connection member capable of compensating for the vertical shrinkage rate of the ceramic sheet shape.

In the present invention, the ceramic sheet shape may be formed of ceramic powder or ceramic powder slurry, or may be formed of a sheet prepared in a sheet shape in advance, but is not limited thereto, and the ceramic sheet shape may be formed by a method known in the art.

For example, the ceramic sheet shape may be formed by mixing and drying the ceramic powder, or may be molded into a predetermined shape after inserting the ceramic powder into a mold. In an embodiment of the present invention, the first conductive structure and the second conductive structure may be RF electrodes or heater electrodes, but are not limited thereto. The heater electrode may include a heater hot wire, etc.

Figure 5A:
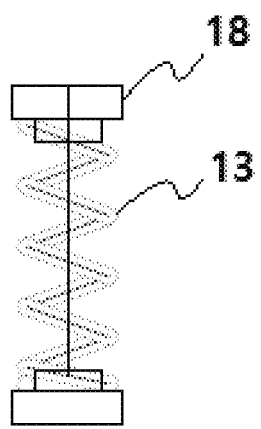
FIG. 5A-FIG. 5D schematically illustrate an embodiment of an electrically conductive connection member capable of compensating for a vertical shrinkage rate of a ceramic sheet shape included in a ceramic structure according to the present invention.
Figure 5B:
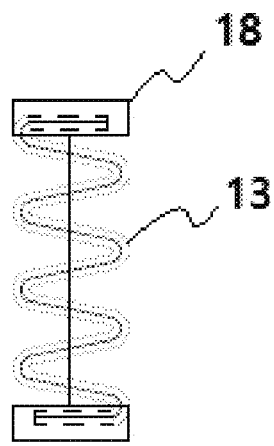
Figure 5C:
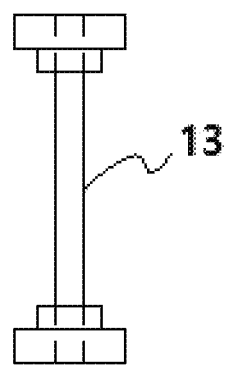

In an embodiment of the present invention, as illustrated in FIGS. 5A to 5C, the electrically conductive connection member 13 capable of compensating for the vertical shrinkage rate of the ceramic sheet shape may be a connection member having vertical elasticity, and the connection member having vertical elasticity may be at least one selected from an elastic wire, a spring, and the like. The elastic wire may include a linear elastic wire, a zigzag elastic wire, and the like. As the spring, all springs known in the art may be used, for example, a cylindrical spring or the like may be used.

Figure 5D:
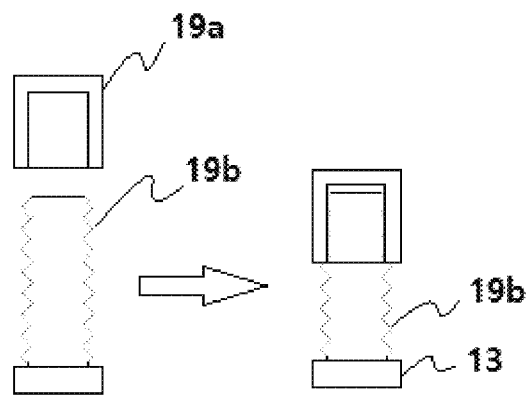

Further, as illustrated in FIG. 5D, the electrically conductive connection member 13 may be a connection member including a cap 19a and an insertion member 19b fitted to the cap. The cap may have an insertion groove of the insertion member which is deeper than a vertical shrinkage length of the ceramic sheet shape.

As an embodiment, the connection member including the cap and the insertion member fitted to the cap may be embedded in the form of fastening partially the cap and the insertion member by considering the vertical shrinkage rate of the ceramic sheet sheep or embedded in the form of forming a gap to be fastened by the shrinkage of the ceramic sheet shape during sintering.

Further, as illustrated in FIGS. 5A-5C, the electrically conductive connection member 13 capable of compensating for the vertical shrinkage rate of the ceramic sheet shape may further include a connection terminal 18 at an end thereof to increase a contact area with the conduction structure and form a stable contact with the conduction structure. As the connection terminal 18, various types known in the art may be used.

The connection terminal 18 further facilitates the electrical connection between the electrically conductive connection member 13 capable of compensating for the vertical shrinkage rate of the ceramic sheet shape and the conductive structures 11 and 12 and more reliably forms a contact therebetween in terms of the increased contact area with the conductive structure, the stable contact, etc.

As the connection terminal 18, it is preferable that a front end surface opposite to a portion where the conductive connection member is fixed has a cross-sectional area of 2 to 100 times larger than that of the end of the conductive connection member. The conductive connection member may be fixed to the connection terminal by welding.

In an embodiment of the present invention, ceramic materials constituting the ceramic sheets of the first layer to the third layer may include at least one selected from the group consisting of aluminum nitride, SIC, SIN, $Al_2O_3$, AlON, etc. Among these, aluminum nitride and the like may be preferably used.

In an embodiment of the present invention, the first conductive structure and the second conductive structure may be formed by using a structure having a predetermined shape, or may also be formed by printing the conductive structure on the ceramic sheet shape, but is not limited thereto, and any method known in the art may be applied without limitation.

In an embodiment of the present invention, in step (c), the electrically conductive connection member capable of compensating for the vertical shrinkage rate of the ceramic sheet shape may be installed by a method of implanting on the ceramic sheet of the second layer. However, the present invention is not limited thereto, and the electrically conductive connection member may be installed by forming a hole on the ceramic sheet of the second layer and inserting the electrically conductive connection member capable of compensating for the vertical shrinkage rate of the ceramic sheet shape in the hole.

In an embodiment of the present invention, the lamination of the ceramic sheets in steps (a) to (f) is made in a mold formed with sidewalls, and in step (g), the sintering may be performed by a method of applying pressure in a vertical direction. The vertical pressure may be applied by, for example, hot press.

The vertical pressure is applied at 50 bar to 250 bar, and the sintering may be performed at a temperature of 1,500° C. to 1,900° C., but may also be performed by a method known in the art.

In an embodiment of the present invention, the ceramic structure may be a seamless monolithic ceramic structure.

In the manufacturing method of the ceramic structure of the present invention, other configurations except for the technical features defined above may be applied to methods known in the art without limitation. For example, the connection line 15 and the like may be formed by methods known in the art.

Figure 3:
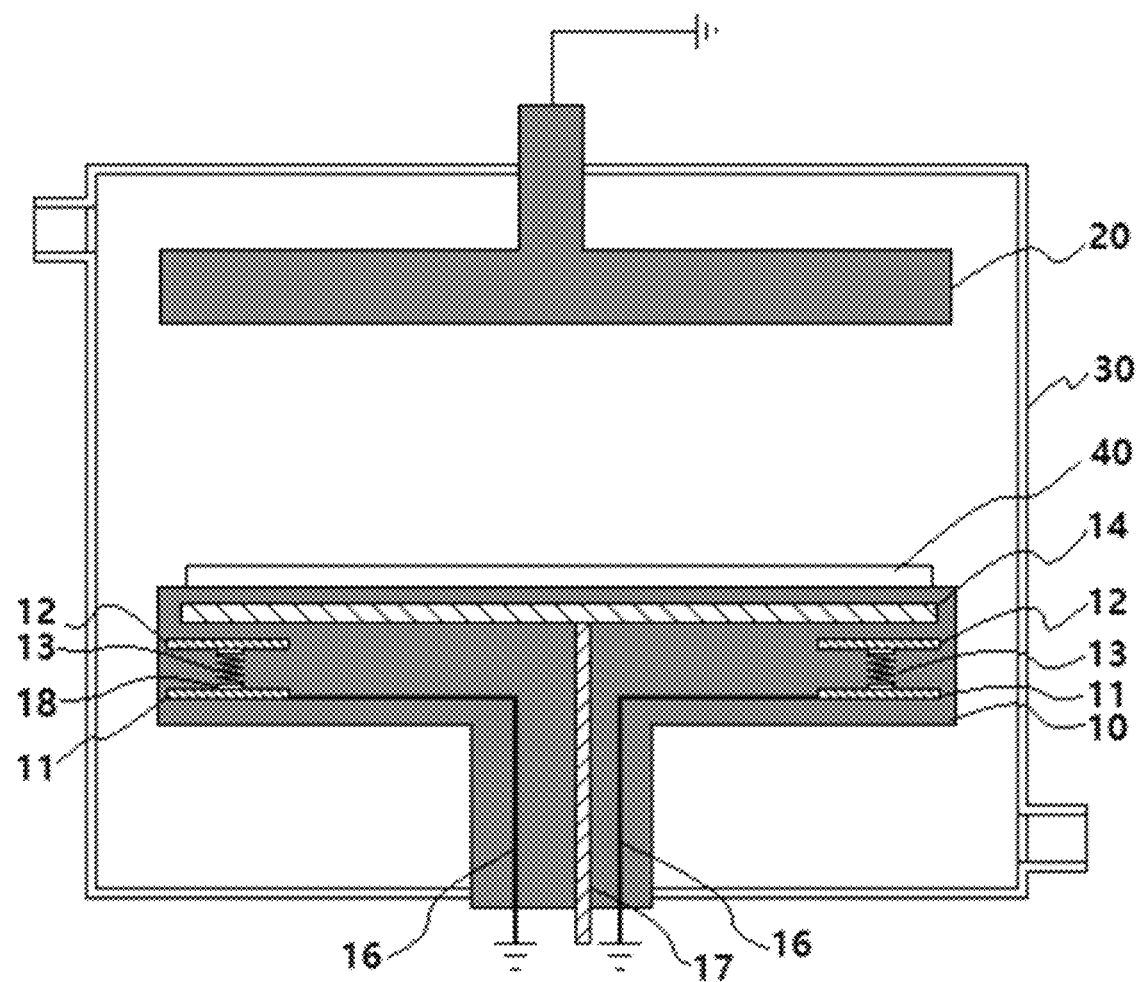
FIG. 3 is a diagram schematically illustrating an embodiment of a plasma processing apparatus including a ceramic structure according to the present invention.
Figure 4:
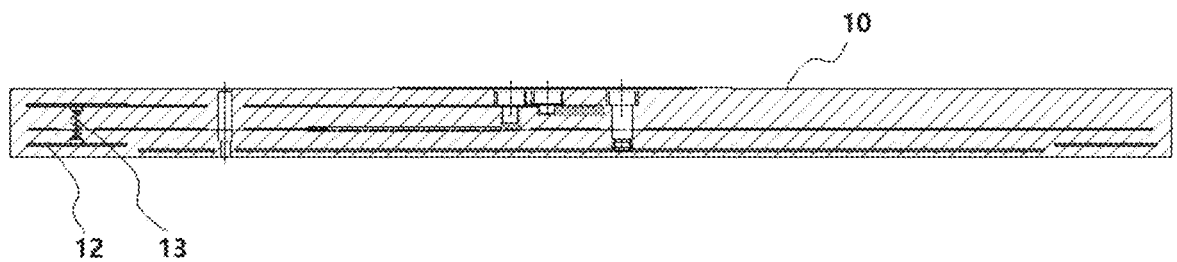
FIG. 4 is a diagram schematically illustrating an embodiment of a ceramic structure according to the present invention.

Further, as illustrated in FIGS. 3 and 4, the present invention relates to a ceramic structure including a first conductive structure 11 embedded therein and a second conductive structure 12 embedded at a different depth from the first conductive structure 11, wherein the first conductive structure 11 and the second conductive structure 12 are electrically connected to each other by the electrically conductive connection member 13 compensating for the vertical shrinkage rate of the ceramic sheet shape while being embedded therein when sintering the ceramic structure.

All the contents described in the manufacturing method of the ceramic structure may be applied to the ceramic structure of the present invention as it is. Therefore, hereinafter, unnecessary overlapping contents will be omitted.

In an embodiment of the present invention, the first conductive structure 11 and the second conductive structure 12 may be RF electrodes or heater electrodes, but are not limited thereto.

In an embodiment of the present invention, as illustrated in FIGS. 5A to 5C, the electrically conductive connection member 13 compensating for the vertical shrinkage rate of the ceramic sheet shape may be a connection member having vertical elasticity, and the connection member having vertical elasticity may be at least one selected from an elastic wire, a spring, and the like. The elastic wire may include a linear elastic wire, a zigzag elastic wire, and the like. As the spring, all springs known in the art may be used, for example, a cylindrical spring or the like may be used.

Further, as illustrated in FIG. 5D, the electrically conductive connection member 13 may be a connection member including a cap 19a and an insertion member 19b fitted to the cap. The cap may have an insertion groove of the insertion member which is deeper than a vertical shrinkage length of the ceramic sheet shape.

As an embodiment, the connection member including the cap and the insertion member fitted to the cap may be embedded in the form of fastening partially the cap and the insertion member by considering the vertical shrinkage rate of the ceramic sheet sheep or embedded in the form of forming a gap to be fastened by the shrinkage of the ceramic sheet shape during sintering.

Further, as illustrated in FIG. 5, the electrically conductive connection member 13 capable of compensating for the vertical shrinkage rate of the ceramic sheet shape may further include a connection terminal 18 at an end thereof to increase a contact area with the conduction structure and form a stable contact. As the connection terminal 18, various types known in the art may be used.

The connection terminal 18 further facilitates the electrical connection between the electrically conductive connection member 13 capable of compensating for the vertical shrinkage rate of the ceramic sheet shape and the conductive structures 11 and 12 and more reliably forms a contact therebetween in terms of the increased contact area with the conductive structure, the stable contact, etc.

As the connection terminal 18, it is preferable that a front end surface opposite to a portion where the conductive connection member is fixed has a cross-sectional area of 2 to 100 times larger than that of the end of the conductive connection member. The conductive connection member may be fixed to the connection terminal by welding.

In an embodiment of the present invention, ceramic materials constituting the ceramic structure may include at least one selected from the group consisting of aluminum nitride, SIC, SIN, $Al_2O_3$, AlON, etc. Among these, aluminum nitride and the like may be preferably used.

In an embodiment of the present invention, the ceramic structure may be a seamless monolithic ceramic structure.

In an embodiment of the present invention, as illustrated in FIG. 3, the ceramic structure may be used as a supporter of a processing substrate in the plasma processing apparatus, but is not limited thereto.

Further, the present invention relates to a plasma processing apparatus including the ceramic structure of the present invention as a supporter of a processing substrate.

In the plasma processing apparatus, other configurations except the ceramic structure of the present invention may be employed without limitation in configurations known in the art. Therefore, description of other configurations will be omitted.

While the preferred embodiments of the present invention have been described in detail, the scope of the present invention is not limited thereto and also covers various modifications and changes of those skilled in the art using a basic concept of the present invention which is defined in appended claims.

| | |
|---|---|
| 10: Ceramic structure | 11: First conductive structure |
| 12: Second conductive structure | 13: Electrically conductive connection member |
| 14: Heater electrode | 15: Horizontal connection line |
| 16: RF electrode lead wire | 17: Heater electrode lead wire |
| 18: Connection terminal | 19a: Cap |
| 19b: Insertion member | 20: Shower head |
| 30: Plasma processing apparatus chamber | 40: Wafer |

What is claimed is:

1. A manufacturing method of a ceramic structure comprising:
    (a) forming a ceramic sheet shape of a first layer;
    (b) forming a first conductive structure on the ceramic sheet shape of the first layer;
    (c) forming a ceramic sheet shape of a second layer on the first conductive structure;
    (d) embedding an electrically conductive connection member capable of compensating for a vertical shrinkage rate of the ceramic sheet shape in the ceramic sheet shape of the second layer;
    (e) forming a second conductive structure on the ceramic sheet shape of the second layer;
    (f) forming a ceramic sheet shape of a third layer on the second conductive structure; and
    (g) sintering a ceramic sheet-shaped laminate manufactured in step (f),
    wherein the ceramic structure includes a structure in which the first conductive structure and the second conductive structure are electrically connected to each other by the electrically conductive connection member capable of compensating for the vertical shrinkage rate of the ceramic sheet shape.

2. The manufacturing method of the ceramic structure of claim 1, wherein the first conductive structure and the second conductive structure are RF electrodes or heater electrodes.

3. The manufacturing method of the ceramic structure of claim 1, wherein the electrically conductive connection member capable of compensating for the vertical shrinkage rate of the ceramic sheet shape is a connection member having vertical elasticity.

4. The manufacturing method of the ceramic structure of claim 3, wherein the connection member having vertical elasticity includes at least one selected from the group consisting of an elastic wire and a spring.

5. The manufacturing method of the ceramic structure of claim 1, wherein the electrically conductive connection member capable of compensating for the vertical shrinkage rate of the ceramic sheet shape is a connection member including a cap and an insertion member fitted to the cap.

6. The manufacturing method of the ceramic structure of claim 5, wherein the cap has an insertion groove of the insertion member which is deeper than a vertical shrinkage length of the ceramic sheet shape.

7. The manufacturing method of the ceramic structure of claim 1, wherein ceramic materials constituting the ceramic sheets of the first layer to the third layer are at least one selected from the group consisting of aluminum nitride, SIC, SIN, $Al_2O_3$, and AlON.

8. The manufacturing method of the ceramic structure of claim 1, wherein the ceramic sheet shape of the first layer to the third layer is formed of ceramic powder or ceramic powder slurry or formed of a sheet prepared in a sheet shape in advance.

9. The manufacturing method of the ceramic structure of claim 1, wherein the first conductive structure and the second conductive structure are formed by using a structure having a predetermined shape or formed by printing a conductive structure on the ceramic sheet shape.

10. The manufacturing method of the ceramic structure of claim 1, wherein in step (c), the electrically conductive connection member capable of compensating for the vertical shrinkage rate of the ceramic sheet shape is installed by a method of implanting on the ceramic sheet of the second layer.

11. The manufacturing method of the ceramic structure of claim 1, wherein in steps (a) to (f), the lamination of the ceramic sheet is performed in the mold and in step (f), the sintering is performed by a method of applying pressure in a vertical direction.

12. A ceramic structure comprising:
    a first conductive structure embedded therein; and
    a second conductive structure embedded at a different depth from the first conductive structure,
    wherein the first conductive structure and the second conductive structure are electrically connected to each other by an electrically conductive connection member compensating for a vertical shrinkage rate of the ceramic sheet shape while being embedded therein when sintering the ceramic structure.

13. The ceramic structure of claim 12, wherein the first conductive structure and the second conductive structure are RF electrodes or heater electrodes.

14. The ceramic structure of claim 12, wherein the electrically conductive connection member compensating for the vertical shrinkage rate of the ceramic sheet shape is a connection member having vertical elasticity.

15. The ceramic structure of claim 14, wherein the connection member having vertical elasticity includes at least one selected from the group consisting of an elastic wire and a spring.

16. The ceramic structure of claim 12, wherein the electrically conductive connection member compensating for the vertical shrinkage rate of the ceramic sheet shape is a connection member including a cap and an insertion member fitted to the cap.

17. The ceramic structure of claim 16, wherein the cap has an insertion groove of the insertion member which is deeper than a vertical shrinkage length of the ceramic sheet shape.

18. The ceramic structure of claim 12, wherein the electrically conductive connection member compensating for the vertical shrinkage rate of the ceramic sheet shape further includes a connection terminal at an end for an increase in contact area with the conductive structure and a stable contact.

19. The ceramic structure of claim 12, wherein the ceramic structure is a seamless monolithic ceramic structure.

20. A plasma processing apparatus comprising the ceramic structure of claim 12 as a supporter of a processing substrate.

* * * * *